United States Patent
Chen et al.

(10) Patent No.: US 10,231,361 B2
(45) Date of Patent: Mar. 12, 2019

(54) FAN SYSTEM MANAGEMENT

(71) Applicant: Quanta Computer Inc., Taoyuan (TW)

(72) Inventors: Chao-Jung Chen, Taoyuan (TW); Chih-Ming Chen, Taoyuan (TW)

(73) Assignee: Quanta Computer Inc., Taoyuan (TW)

( * ) Notice: Subject to any disclaimer, the term of this patent is extended or adjusted under 35 U.S.C. 154(b) by 51 days.

(21) Appl. No.: 14/980,688

(22) Filed: Dec. 28, 2015

(65) Prior Publication Data
US 2017/0034953 A1 Feb. 2, 2017

Related U.S. Application Data

(60) Provisional application No. 62/198,718, filed on Jul. 30, 2015.

(51) Int. Cl.
*H05K 7/20* (2006.01)
*F04D 29/60* (2006.01)
*F04D 25/06* (2006.01)

(52) U.S. Cl.
CPC ..... *H05K 7/20727* (2013.01); *F04D 25/0613* (2013.01); *F04D 29/601* (2013.01)

(58) Field of Classification Search
CPC .......... H05K 7/20736; H05K 7/20727; H05K 7/1492; F04D 29/601; F04D 25/0613
USPC ........................ 361/679.46–679.51, 688–697
See application file for complete search history.

(56) References Cited

U.S. PATENT DOCUMENTS

| | | | |
|---|---|---|---|
| 5,788,467 A * | 8/1998 | Zenitani | H05K 7/20581 361/694 |
| 6,373,698 B1 * | 4/2002 | Christensen | G06F 1/20 174/16.1 |
| 6,625,033 B1 * | 9/2003 | Steinman | H05K 7/20581 174/382 |
| 7,054,155 B1 * | 5/2006 | Mease | H05K 7/20581 165/104.34 |
| 7,408,772 B2 | 8/2008 | Mease et al. | |
| 8,320,120 B1 * | 11/2012 | Chan | H05K 7/20727 165/121 |
| 9,060,441 B2 * | 6/2015 | Jiang | H05K 7/1427 |

(Continued)

FOREIGN PATENT DOCUMENTS

TW 201519731 A 5/2015

OTHER PUBLICATIONS

Taiwanese Office Action No. 105106639 dated Dec. 6, 2016 w/ English First Office Action Summary Table.

*Primary Examiner* — Jayprakash N Gandhi
*Assistant Examiner* — Yahya Ahmad
(74) *Attorney, Agent, or Firm* — Nixon Peabody LLP; Zhou Lu

(57) ABSTRACT

In some embodiments, a rack system is configured to comprise a removable fan system. The fan system enables thermal management of the rack system. The removable fan system includes a replaceable fan tray that can be assembled in the rack system by engaging a connecting mechanism and connecting a connecting cable. The fan tray is engaged with the connecting mechanism to be securely attached to the rack system. The fan tray is connected to a bus bar to receive power or necessary data to be operated. The fan tray can be disassembled from the rack system while the bus remains active, and enables access to the server or the rack system. The replaceable fan tray enables easy replacement of the fan system and access to the rear side of the rack system.

18 Claims, 6 Drawing Sheets

(56) References Cited

U.S. PATENT DOCUMENTS

| | | | | |
|---|---|---|---|---|
| 2002/0048520 A1* | 4/2002 | Lu | H05K 7/20581 | 417/360 |
| 2004/0075983 A1* | 4/2004 | Thompson | H05K 7/20581 | 361/679.48 |
| 2005/0254210 A1* | 11/2005 | Grady | H05K 7/20581 | 361/695 |
| 2013/0017693 A1* | 1/2013 | Li | H01R 25/16 | 439/110 |
| 2013/0039002 A1* | 2/2013 | Li | H05K 7/1492 | 361/679.48 |
| 2013/0063894 A1* | 3/2013 | Wang | H05K 7/1492 | 361/692 |
| 2013/0141243 A1* | 6/2013 | Watts | H05K 7/20727 | 340/584 |
| 2013/0155608 A1* | 6/2013 | Tang | G06F 1/20 | 361/679.48 |
| 2013/0188309 A1* | 7/2013 | Ross | H05K 7/20727 | 361/679.48 |
| 2014/0085810 A1* | 3/2014 | Xu | H05K 7/1492 | 361/679.48 |
| 2014/0092541 A1* | 4/2014 | Zhang | G06F 1/20 | 361/679.5 |
| 2014/0293523 A1* | 10/2014 | Jau | H05K 7/14 | 361/679.4 |

* cited by examiner

FAN SYSTEM MANAGEMENT

CROSS REFERENCE TO RELATED APPLICATIONS

This instant application claims priority to U.S. Provisional Application No. 62/198,718, filed Jul. 30, 2015, entitled "Fan door side open design for server system", the contents of which are incorporated by reference herein in its entirety.

TECHNICAL FIELD

The disclosure generally relates to a fan system management and more specifically to maintenance and replacement of a fan without powering off a server.

BACKGROUND

A server is often mounted on a rack system with a fan system. Conventionally, the server is mounted in the front side of the rack system with necessary components to operate the server and the fan system is mounted in the rear side of the rack system for thermal management. Often, the fan system does not include a rear fan door to allow the fan system to be opened from the rear side of the rack system. Thus, to repair the fan system, other components located front side of the rack system must be taken out first to take the fan system out of the rack system. Therefore, it was difficult to make a fan repair or replacement, because it was time consuming to power off the server, take the server out from the rack system, and finally remove the fan system off the rack system for repair. When the server is shut down, it may take some time to get back to the operation mode, and during that time, the server cannot function.

SUMMARY

In some implementations, a rack system includes a fan system for heat dissipation. The fan system includes a removable fan tray that can be inserted or removed from the rack system when needed. The removable fan tray enables to access the rear side of the server mounted on the rear side of the rack, and allows easy maintenance of the server or the fan system.

The removable fan tray is configured to be assembled in the rack system with a connecting device that secures the fan tray in place once fully inserted. The fan tray is further configured to be connected to the rack system by connecting a cable that is engaged with a bus bar going down the height of the rack. The fan tray can be inserted or removed from the rack system while the bus or the server remains active.

When removing from the rack system, the cable needs to be disconnected and the connecting device (e.g. hinge) needs to be disengaged from the rack system. A fan in the fan tray is a removable module that can be inserted or removed individually or as a group. A row, column, or entire set of the fans can be removed as necessary.

Details of one or more implementations are set forth in the accompanying drawings and the description below. Other features, aspects, and potential advantages will be apparent from the description and drawings, and from the claims.

DESCRIPTION OF DRAWINGS

Like reference symbols in the various drawings indicate like elements.

DETAILED DESCRIPTION

Figure 1:
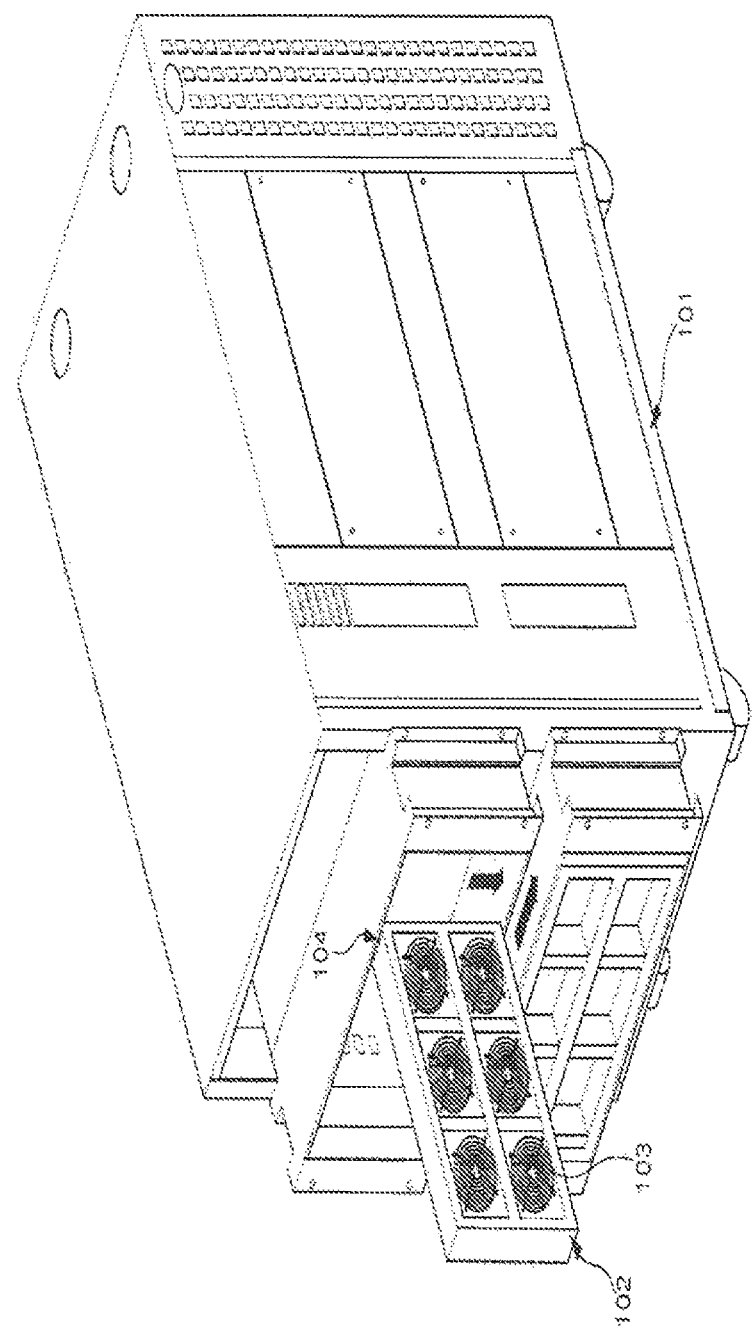
FIG. 1 illustrates an example rack system.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognizes that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

FIG. 1 illustrates an example rack system. The rack system is a fully integrated rack of servers and equipment that are optimized and streamlined for web-scale deployment. The rack system is loaded with server (i.e. chassis) and necessary components to operate the server. For example, the rack system can include a power device (e.g. power shelf) or a bus to deliver power to the server. In some embodiments, the one or more busses can go down the height of the rack that provides power to the server mounted on the rack. A power device (e.g. power shelf) is connected to the one side of the bus and supplies power to the bus. The bus delivers power to the server and the fan system. Various configurations can be achieved depending on the mounting configurations.

In some embodiment, a server can be removable from the rack system. The rack system 101 may have one or more fan trays associated with the removable server. The removable fan tray 102 includes a series of fans to dissipate the heat inside the rack system. The fan tray 102 can be a removable part that can be easily removed from the rack system 101 for repair. The fan tray 102 can be mounted on a pinned hinge so that the full tray can be replaceable. The connecting mechanism 104 can fasten the fan tray 102 with the rack system 101 to securely fix the fan tray 102 to the rack system 101.

To remove the fan tray 102 from the rack system 101, the fan tray 102 needs to be separated from the rack system 101 by disengaging the connection mechanism 104 and moving the fan tray 102 in a designated direction as illustrated in FIG. 1. For example, to take the fan tray 102 apart from the rack system 101, the fan tray 102 needs to be lifted off the hinge (i.e. connection mechanism) and moved to the right direction and downwards as illustrated in the arrowed directions in FIG. 1. The connecting mechanism 104 can include any connecting means such as a latch, hinge, spring, bolt, cable tie, clasp, pin, flange, strap, or hook.

In some embodiments, the fan 103 is assembled in the fan tray 102. The fan tray 102 is shaped to fit the fan 103 into a fan frame. The fan 103 can be hot swappable. The fan 103 can be plugged in and out from the fan tray. The fan 103 can be popped out from the fan tray 102, either individually or as a group. An individual or a group of fans 103 can fit in a single fan tray and can be taken out of the fan tray 102.

Figure 2:
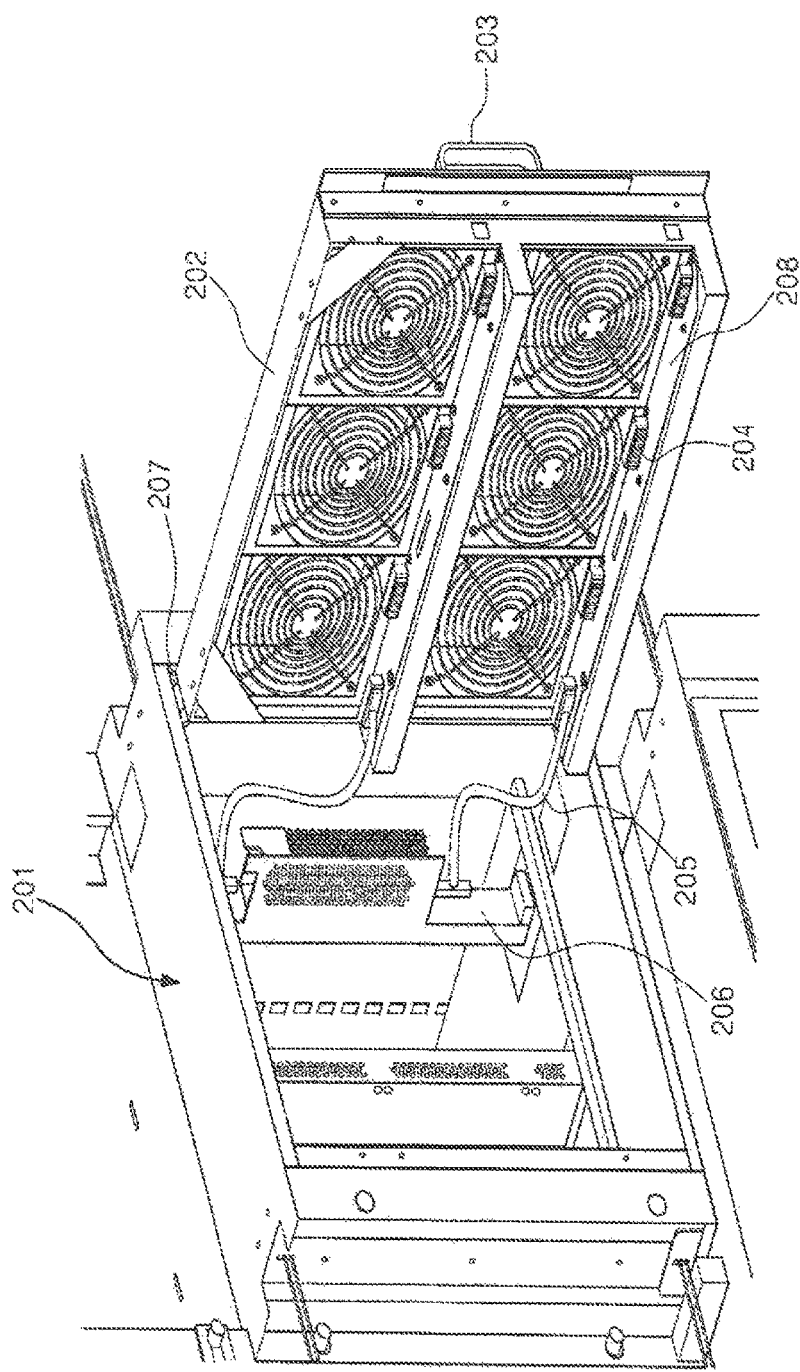
FIG. 2 is an example fan system.

FIG. 2 illustrates an example of fan tray. The fan tray 202 can be attached to the rear side of the rack system 201 and allows access to the rear side of the rack system 201 by opening the fan tray 202 as illustrated in FIG. 2. Thus, it enables maintenance and replacement of the server or rack easily.

The fan tray 202 can be assembled in the rack system 201 with a connection mechanism 207 that secures the fan tray 202 in the rack system 201. The connection mechanism 207 enables the fan tray 202 to be securely attached to the rack system 201. The connecting mechanism 207 enables the fan tray 202 to be opened and removed from the rack system 201. The connecting mechanism 207 can include a latch, hinge, spring, bolt, cable tie, clasp, pin, flange, strap, or hook. For example, to assemble the fan tray 202 to the rack system 201, the fan tray 202 needs to be installed onto a hinge. On the other hand, to disassemble the fan tray 202 from the rack system 201, the fan tray 202 needs to be lifted off the hinge. The connecting mechanism 207 allows the fan tray 202 to make a pivoting movement.

The connecting mechanism 207 allows the fan tray 202 to be removed as a row, column, or entire set of fans. The entire fan tray 202 can be removed by lifting off the connecting mechanism 207. In some embodiments, the fan tray 202 can be removed by a pressure fit type of disengagement mechanism. In some embodiments, the fan tray 202 can be removed by a tool-free or non-tool-free type of disengagement mechanism. There are multiple ways of attaching the fan tray 202 to the rack system 201, and the above described ways are not intended to limit the fastening methods.

The fan tray 202 can be connected to the rack system 201 by connecting a connecting cable 205 to a fan board 208 of the fan tray 202. In some embodiments, the rack system 201 has at least one bus bar or back plane board that runs height of the rack system that delivers power to the rack system 201. The bus bar 206 can be one of a data, controller, or fan power bus. One end of the cable 205 can be connected to the bus bar 206. The other end of the cable 205 can be connected to a fan board (e.g. printed circuit board (PCB)) 208 of the fan tray 202 to deliver power. The fan board 208 can be screwed to the fan tray 202. Each of fans has a corresponding fan board connector 204 to be connected to the power source and allows the fan to receive power from the bus bar 206 or back plane board of the rack system 201. In some embodiments, the fan board 208 can be connected to the back plane board. In some embodiments, the rack system 201 can have at least 4 fan boards 208 installed in the fan tray 202. The fan tray 202 can be removed from the rack system 201 even when the bus bar (or back plane board) 206 or the server remains on and active.

The fans can be installed dual sides to facilitate the air flow. Each of the pair can be individually removable from the fan frame. Both sides of the fans can have wire screen guards for safety during service. The fan tray 202 includes a fan door handle 203 to open the fan door to a designated direction and to allow a pivoting movement of the fan tray 202.

Figure 3A:
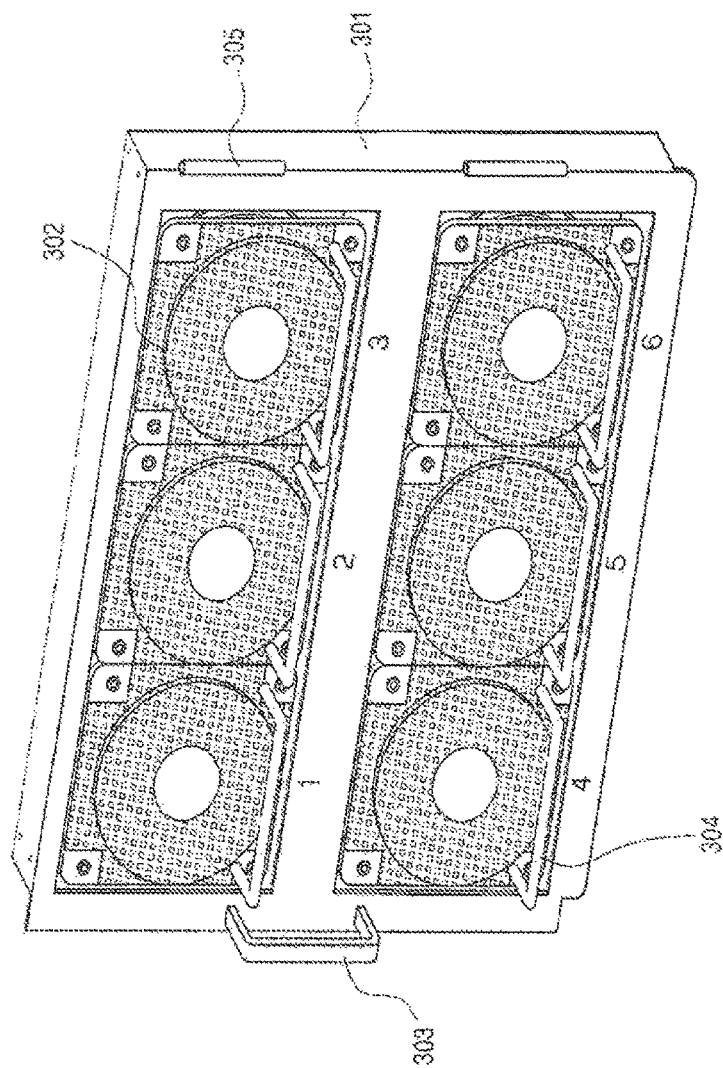
FIGS. 3A and 3B are an example fan tray.
Figure 3B:
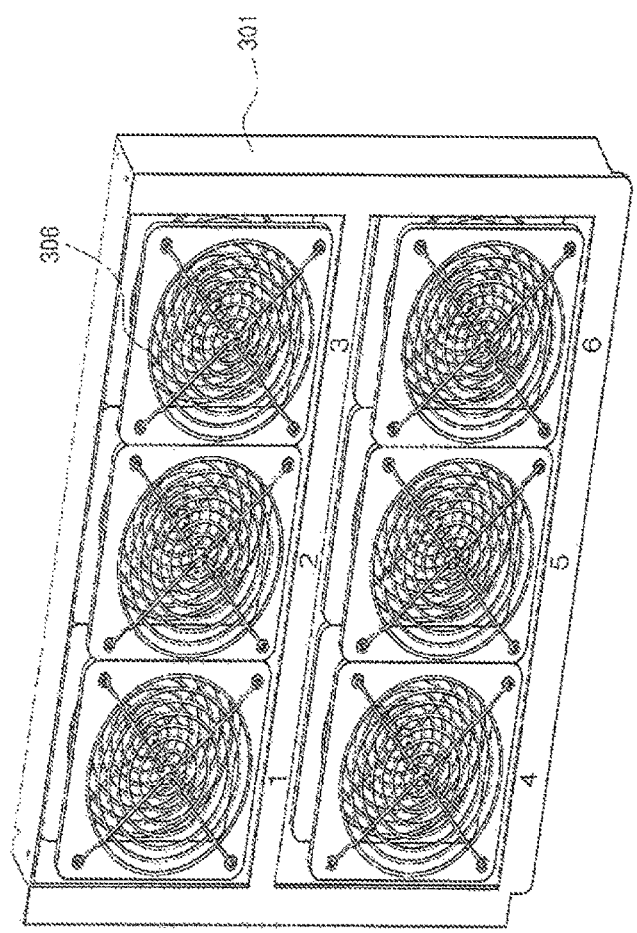
Figure 4:
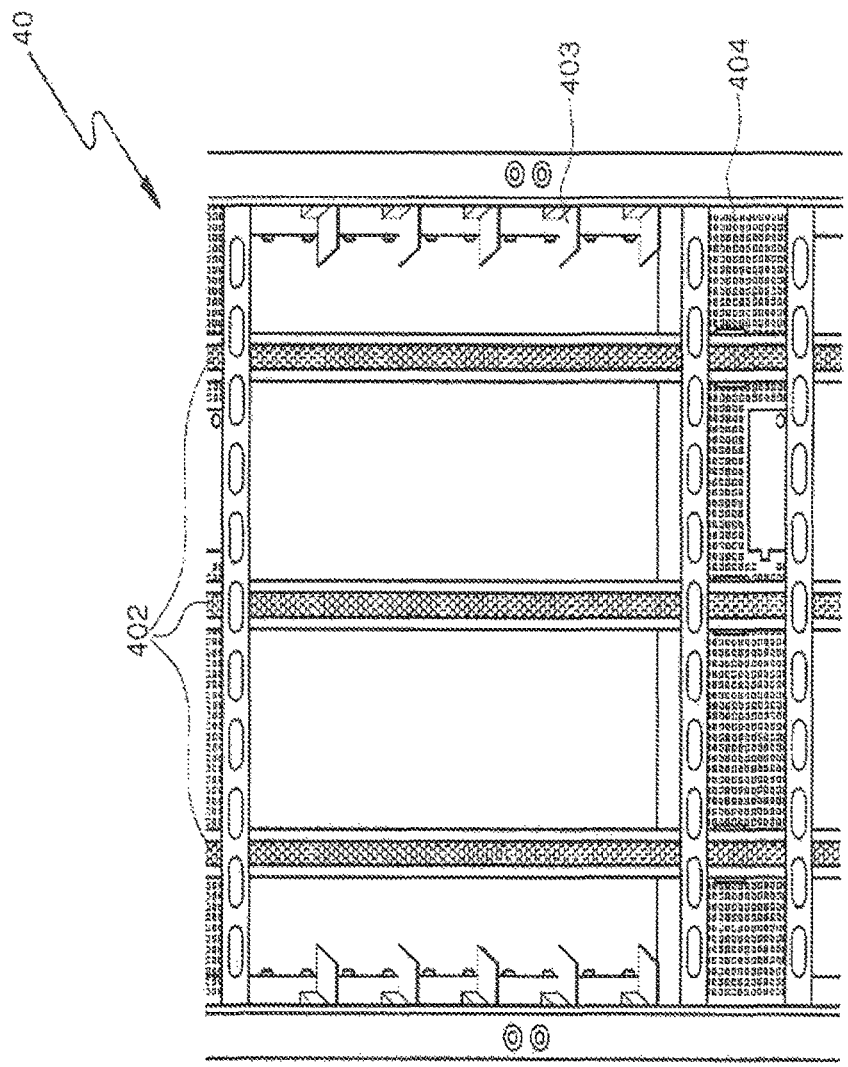
FIG. 4 is an example rear view of the rack system.

FIGS. 3A and 3B illustrate an example fan tray configuration. Particularly, FIG. 3A illustrates a front side (outside) view of the fan tray, and FIG. 3B illustrates a rear side (inside) view of the fan tray. The rear side of the fan tray 301 is not visible from outside of the rack system. The front side of the fan tray 301 is visible from outside of the rack system. The fan tray 301 includes a fan door handle 303 that enables the fan tray 301 to be opened in various directions. The technician can easily open the fan tray 301 by pulling the fan door handle 303 in a designated direction. For example, as illustrated in FIG. 4, the fan tray can be opened forwards. In some embodiments, the fan tray 301 can be opened sideways, upwards, or downwards.

The fan tray 301 includes a set of fans 306. Each fan 306 can be replaceable as individual, row, column, or entire set. For example, FIG. 3 shows that six fans are assembled in the fan tray 301 and each fan is numbered from 1 to 6. Each of the six fans can be individually replaceable or removable when repair is needed. For example, fan 1 can be removed individually from the fan tray 301 by holding a fan handle 304, pushing a latch up, and pulling the fan out. In some embodiments, the top row of fans can be removed (i.e. fans 1-3) together from the fan tray 301. In addition, the entire set of fans (i.e. fans 1-6) can be removed all together from the fan tray 301. The individual fan removal from the fan tray allows easy maintenance and replacement of fan.

The fans 306 can be installed dual sides to facilitate the air flow. Each of the pair can be individually removable from the fan frame. The front side of the fans can have wire screen guards 302 for safety during service. The wire screen guards 302 and the fans 306 can be bolted together so the fans 306 are securely fastened to the fan tray 301. For example, two torque 5 kg-cm pieces can be bolted in the upper part of the fan 306 and two pieces can be bolted in the lower part of the fan 306 to be attached to the wire screen guards 302.

In some embodiments, each fan 306 can be attached to the fan frame through a fastening device. The fan can fit into the fan frame with a latch or hinge system 305 that secures the fan 306 in place once fully inserted. The hinge system 305 can be attached to the rack system using a M10 screw that can endure at least 5 kg of weight. The fastening device can include any fastening means that enables the fan to be securely fitted into the fan frame such as a latch, hinge, spring, bolt, cable tie, clasp, pin, flange, strap, or hook.

FIG. 4 is an example rear view of the rack system. The rack system 40 comprises a bus bar 402 and a power shelf 404. The bus bar 402 can be installed at the rear of the rack system 40. Each bar 402 is connected to the output voltage positive and negative terminations provided by the power shelf 404 installed in the same power zone. The server (e.g. chassis) can be plugged directly into the bus bar 402 using a hot-pluggable assembly. The server can be hot swappable from the front of the rack system and provided with a latch system that locks the server in place once fully inserted. The rear side of the server is accessible from the rear side of the rack system when the fan tray is being taken out of the rack system.

For example, as illustrated in FIG. 4, three pairs of bus bars are installed at the rear side of the rack system. Each bus bar delivers at least a data, controller, or power source. At least one of the bus bar can be connected to the fan tray to provide power or necessary data to operate the fan. The power shelf 404 can be inserted in the middle of the rack system to energize the bus bar 402. The power shelf 404 can be securely positioned in the rack system 402 by inserting the power shelf 404 into the rack side 403. The multiple rack sides 403 enable to accept a plurality of power shelves 404. The power source configurations should not be limited to the described configurations, and can include other configurations that are not described above.

Example System Architecture

Figure 5:
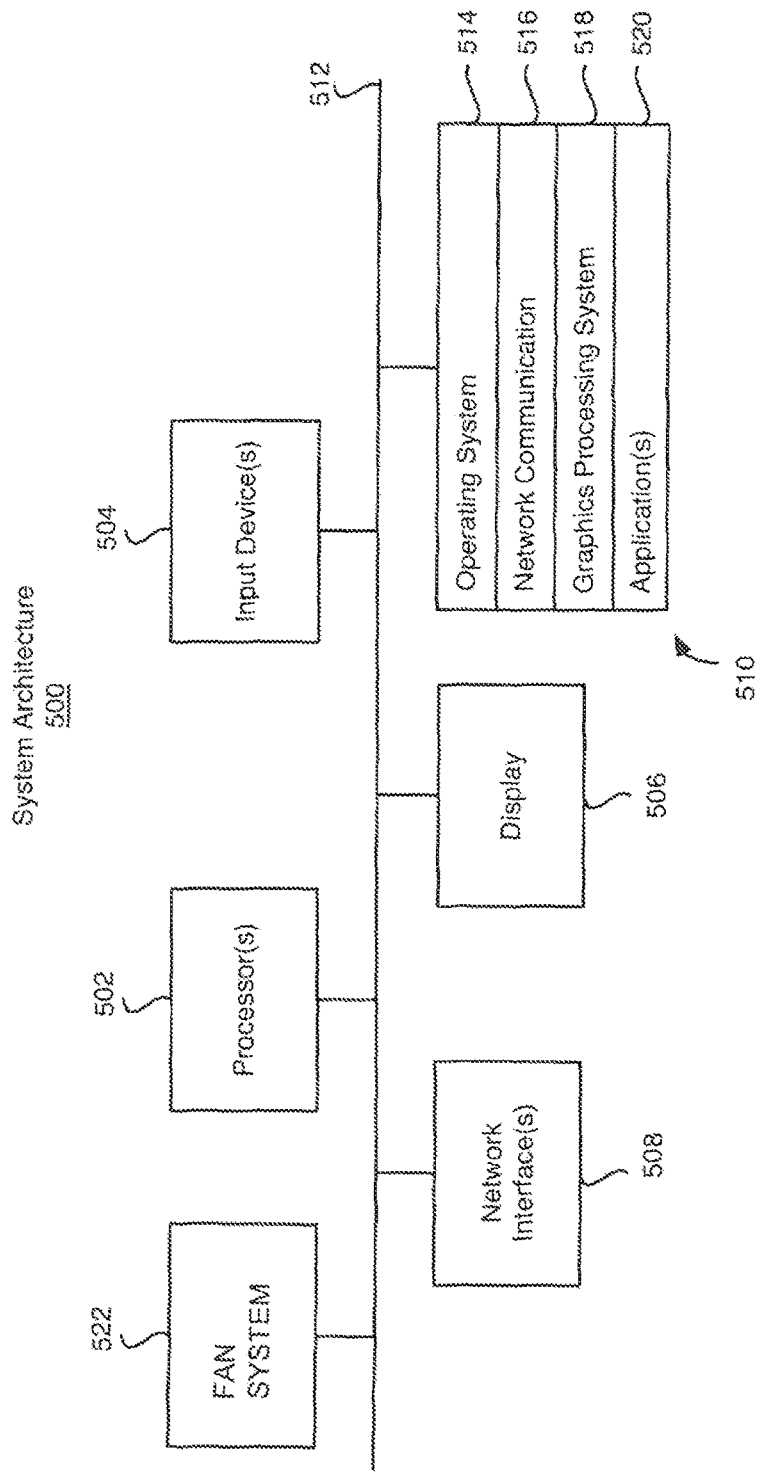
FIG. 5 is a block diagram of an example system architecture implementing the features and structure of FIGS. 1-4.

FIG. 5 is a block diagram of example system architecture 500 implementing the features and processes of FIGS. 1-4. The architecture 500 can be implemented on any electronic device that runs software applications derived from compiled instructions, including without limitation personal computers, servers, smart phones, media players, electronic tablets, game consoles, email devices, etc. In some implementations, the architecture 500 can include one or more processors 502, one or more input devices 504, one or more display devices 506, one or more network interfaces 508 and one or more computer-readable mediums 510. Each of these components can be coupled by bus 512.

Display device 506 can be any known display technology, including but not limited to display devices using Liquid Crystal Display (LCD) or Light Emitting Diode (LED) technology. Processor(s) 502 can use any known processor technology, including but are not limited to graphics processors and multi-core processors. Input device 504 can be any known input device technology, including but not limited to a keyboard (including a virtual keyboard), mouse, track ball, and touch-sensitive pad or display. Bus 512 can be any known internal or external bus technology, including but not limited to ISA, EISA, PCI, PCI Express, NuBus, USB, Serial ATA or FireWire.

Computer-readable medium 510 can be any medium that participates in providing instructions to processor(s) 502 for execution, including without limitation, non-volatile storage media (e.g., optical disks, magnetic disks, flash drives, etc.) or volatile media (e.g., SDRAM, ROM, etc.). The computer-readable medium (e.g., storage devices, mediums, and memories) can include, for example, a cable or wireless signal containing a bit stream and the like. However, when mentioned, non-transitory computer-readable storage media expressly exclude media such as energy, carrier signals, electromagnetic waves, and signals per se.

Computer-executable instructions include, for example, instructions and data which cause a general purpose computer, special purpose computer, or special purpose processing device to perform a certain function or group of functions. Computer-executable instructions also include program modules that are executed by computers in stand-alone or network environments. Generally, program modules include routines, programs, components, data structures, objects, and the functions inherent in the design of special-purpose processors, etc. that perform particular tasks or implement particular abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Computer-readable medium 510 can include various instructions 514 for implementing an operating system (e.g., Mac OS®, Windows®, Linux). The operating system can be multi-user, multiprocessing, multitasking, multithreading, real-time and the like. The operating system performs basic tasks, including but not limited to: recognizing input from input device 504; sending output to display device 506; keeping track of files and directories on computer-readable medium 510; controlling peripheral devices (e.g., disk drives, printers, etc.) which can be controlled directly or through an I/O controller; and managing traffic on bus 512. Network communications instructions 516 can establish and maintain network connections (e.g., software for implementing communication protocols, such as TCP/IP, HTTP, Ethernet, etc.).

A graphics processing system 518 can include instructions that provide graphics and image processing capabilities. Application(s) 520 can be an application that uses or implements the processes described in reference to FIGS. 1-4. The processes can also be implemented in operating system 514.

Fan system 522 can include a controller having memory and an interface that provides a connection to a processor. The processor can provide instructions to the fan system to operate the fan when needed. The fan system also includes a temperature sensor that detects and monitors the temperature of the rack system. The fan system is responsive to the communication provided by the processor in accordance with the control instructions.

The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language (e.g., Objective-C, Java), including compiled or interpreted languages, and it can be deployed in any form, including as a stand-alone program or as a module, component, subroutine, or other unit suitable for use in a computing environment.

For clarity of explanation, the illustrative system embodiment is presented as including individual functional blocks including functional blocks labeled as a "processor" or processor 502. The functions these blocks represent may be provided through the use of either shared or dedicated hardware, including, but not limited to, hardware capable of executing software and hardware, such as a processor 502, that is purpose-built to operate as an equivalent to software executing on a general purpose processor. For example the functions of one or more processors presented in FIG. 5 may be provided by a single shared processor or multiple processors. (Use of the term "processor" should not be construed to refer exclusively to hardware capable of executing software.) Illustrative embodiments may include microprocessor and/or digital signal processor (DSP) hardware, read-only memory (ROM) for storing software performing the operations described below, and random access memory (RAM) for storing results. Very large scale integration (VLSI) hardware embodiments, as well as custom VLSI circuitry in combination with a general purpose DSP circuit, may also be provided.

The logical operations of the various embodiments are implemented as: (1) a sequence of computer implemented steps, operations, or procedures running on a programmable circuit within a general use computer, (2) a sequence of computer implemented steps, operations, or procedures running on a specific-use programmable circuit; and/or (3) interconnected machine modules or program engines within the programmable circuits. The system can practice all or part of the recited methods, can be a part of the recited systems, and/or can operate according to instructions in the recited tangible computer-readable storage devices. Such logical operations can be implemented as modules configured to control the processor to perform particular functions according to the programming of the module.

Suitable processors for the execution of a program of instructions include, by way of example, both general and special purpose microprocessors, and the sole processor or one of multiple processors or cores, of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer.

The features can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include, e.g., a LAN, a WAN, and the computers and networks forming the Internet.

The computer system can include clients and servers. A client and server are generally remote from each other and typically interact through a network. The relationship of client and server arises by virtue of computer programs running on the respective computers and having a client-server relationship to each other.

One or more features or steps of the disclosed examples can be implemented using an API. An API can define on or more parameters that are passed between a calling application and other software code (e.g., an operating system, library routine, function) that provides a service, that provides data, or that performs an operation or a computation.

The API can be implemented as one or more calls in program code that send or receive one or more parameters through a parameter list or other structure based on a call convention defined in an API specification document. A parameter can be a constant, a key, a data structure, an object, an object class, a variable, a data type, a pointer, an array, a list, or another call. API calls and parameters can be implemented in any programming language. The programming language can define the vocabulary and calling convention that a programmer will employ to access functions supporting the API.

In some implementations, an API call can report to an application the capabilities of a device running the application, such as input capability, output capability, processing capability, power capability, communications capability, etc.

A number of implementations have been described. Nevertheless, it will be understood that various modifications may be made. For example, other steps may be provided, or steps may be eliminated, from the described flows, and other components may be added to, or removed from, the described systems. Accordingly, other implementations are within the scope of the following claims.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

The various embodiments described above are provided by way of illustration only and should not be construed to limit the scope of the disclosure. Any of the features disclosed with respect to any particular examples can be mixed and matched with any other examples or any other discussion of features. Various modifications and changes may be made to the principles described herein without following the example embodiments and applications illustrated and described herein, and without departing from the spirit and scope of the disclosure. Claim language reciting "at least one of" a set indicates that one member of the set or multiple members of the set satisfy the claim.

The invention claimed is:

1. A device, comprising:
a rack system, the rack system comprising:
  a server, the server being mounted on the rack system;
  a bus bar, the server being powered by the bus bar, the bus bar running the height of the rack system, the server plugged directly into the bus bar via a hot-pluggable assembly;
  a plurality of rack side pairs;
  a power shelf being inserted in a middle portion of the rack system to energize the bus bar, the power shelf being inserted into one of the plurality of rack side pairs, the plurality of rack side pairs capable of accepting a plurality of power shelves; and
a fan system, the fan system being connected to the rack system, the fan system comprising:
  a fan tray comprising a fan board, the fan tray connected to the bus bar via a cable, the fan tray connected to the rack system via a hinge and capable of being rotated open or closed around the hinge, the fan tray capable of fitting a plurality of fans, each of the plurality of fans connected to the fan board via a respective fan board connector, wherein any of the plurality of fans or the fan tray is removable from the rack system while the server is active, wherein each of the plurality of fans has a fan handle, and is removed from the fan tray by holding the fan handle and pushing a latch up,
  wherein, while the fan tray in an open position, the fan tray is capable of being vertically lifted off from the hinge.

2. The device of claim 1, wherein a rear side of the server is accessible by removing the fan tray from the rack system.

3. The device of claim 1, wherein the fan tray is connected to the bus bar through a cable, the cable is plugged into the fan board of the fan tray.

4. The device of claim 1, wherein the fan tray is attached to the rack system through a connection mechanism.

5. The device of claim 1, wherein the fan tray is connected to the rack system via a connection mechanism, the connection mechanism comprising at least one of latch, hinge, spring, bolt, cable tie, clasp, pin, flange, strap, or hook.

6. The device of claim 1, wherein the fan tray is connected to the rack system via a connection mechanism, the fan tray capable of being removed from the rack system by disengagement of the connection mechanism.

7. The device of claim 6, wherein the connection mechanism permits a pivoting movement of the fan tray.

8. The device of claim 1, wherein the fan tray further comprises a fan tray handle, the fan tray handle permitting a pivoting movement of the fan tray.

9. The device of claim 1, wherein the bus bar is at least one of a data bus bar, a controller bus bar, or a fan power bus bar.

10. The device of claim 1, wherein the fan tray is removable from the rack system while the bus bar is active.

11. The device of claim 1, wherein, while the fan tray in an open position, the fan tray is capable of receiving power from the bus bar via the cable.

12. The device of claim 1, wherein the front side of each fan of the plurality of fans is bolted together with a wire screen guard using screws capable of enduring at least 5kg of weight.

13. A fan device, comprising:
   a plurality of fans, and
   a fan tray comprising a fan board, the fan tray connected to a bus bar of a rack system via a cable, the bus bar running the height of the rack system, the fan tray connected to the rack system via a hinge and capable of being rotated open or closed around the hinge, the fan tray capable of fitting the plurality of fans, each of the plurality of fans connected to the fan board via a respective fan board connector, wherein any of the plurality of fans or the fan tray is removable from the rack system while the server is active, wherein each of the plurality of fans has a fan handle, and is removed from the fan tray by holding the fan handle and pushing a latch up, wherein the server is plugged directly into the bus bar via a hot-pluggable assembly,
   wherein the fan tray is configured to be connected to a rack system,
   wherein the rack system comprises a plurality of rack side pairs, and a power shelf being inserted in a middle portion of the rack system to energize the bus bar, the power shelf being inserted into one of the plurality of rack side pairs, the plurality of rack side pairs capable of accepting a plurality of power shelves,
   wherein while the fan tray in an open position, the fan tray is capable of being vertically lifted off from the hinge.

14. The fan device of claim 13, wherein the fan tray is alternatively connected to the rack system through a connection mechanism, the connection mechanism comprising at least one of a spring, a latch, a hook, or a screw.

15. The fan device of claim 13, wherein the fan tray is connected to the bus bar of the rack system through a connecting cable, the fan device being powered from the bus bar.

16. A method of removing a fan tray from a rack system, comprising:
   causing the fan tray to be opened, the fan tray configured to be opened pivotally by pulling a fan door handle;
   causing a fan cable to be removed from the fan tray by unplugging the fan cable from a circuit board of the fan tray, the fan tray connected to a bus bar of the rack system via a cable, the bus bar running the height of the rack system, the fan tray capable of fitting a plurality of fans, each of the plurality of fans connected to the circuit board of the fan tray via a respective fan board connector, wherein any of the plurality of fans or the fan tray is removable from the rack system while the server is active, the fan tray connected to the rack system via a hinge and capable of being rotated open or closed around the hinge, wherein each of the plurality of fans has a fan handle, and is removed from the fan tray by holding the fan handle and pushing a latch up, wherein the server is plugged directly into the bus bar via a hot-pluggable assembly, wherein the rack system comprises a plurality of rack side pairs, and a power shelf being inserted in a middle portion of the rack system to energize the bus bar, the power shelf being inserted into one of the plurality of rack side pairs, the plurality of rack side pairs capable of accepting a plurality of power shelves; and
   causing the fan tray to be slid to a designated direction to remove the fan tray from the rack system by disengagement of the hinge, wherein, while the fan tray in an open position, the fan tray is capable of being vertically lifted off from the hinge.

17. The method of claim 16, wherein a server is mounted on the rack system, the fan tray configured to be removed from the rack system while the server is active.

18. The method of claim 16, further comprising:
   causing a fan of plurality of fans to be removed from the fan tray, the fan tray configured to receive the fan.

* * * * *